US012628498B2

(12) United States Patent
Wang et al.

(10) Patent No.: US 12,628,498 B2
(45) Date of Patent: May 12, 2026

(54) DISPLAY SUBSTRATE FOR AVOIDING LATERAL LEAKAGE AND PREPARATION METHOD THEREFOR, AND DISPLAY APPARATUS

(71) Applicant: BOE Technology Group Co., Ltd., Beijing (CN)

(72) Inventors: Qing Wang, Beijing (CN); Kuanta Huang, Beijing (CN); Xiaochuan Chen, Beijing (CN); Yongfa Dong, Beijing (CN); Xiong Yuan, Beijing (CN); Hui Tong, Beijing (CN); Yu Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 885 days.

(21) Appl. No.: 17/765,451

(22) PCT Filed: May 14, 2021

(86) PCT No.: PCT/CN2021/093943
§ 371 (c)(1),
(2) Date: Mar. 31, 2022

(87) PCT Pub. No.: WO2021/254059
PCT Pub. Date: Dec. 23, 2021

(65) Prior Publication Data
US 2022/0367581 A1    Nov. 17, 2022

(30) Foreign Application Priority Data
Jun. 19, 2020    (CN) .......................... 202010565939.8

(51) Int. Cl.
H10K 59/122 (2023.01)
H10K 59/12 (2023.01)
(Continued)

(52) U.S. Cl.
CPC ..... H10K 59/122 (2023.02); H10K 59/80515 (2023.02); *H10K 59/1201* (2023.02);
(Continued)

(58) Field of Classification Search
None
See application file for complete search history.

(56) References Cited

U.S. PATENT DOCUMENTS

2009/0026928 A1* 1/2009 Park ...................... C07D 265/38
544/102
2010/0213827 A1* 8/2010 Yoshida ............... H10K 59/122
313/504
(Continued)

FOREIGN PATENT DOCUMENTS

CN        103531609 A     1/2014
CN        104659070 A     5/2015
(Continued)

OTHER PUBLICATIONS

Office Action dated Sep. 30, 2022 for Chinese Patent Application No. 202010565939.8 and English Translation.
(Continued)

*Primary Examiner* — Sue A Purvis
*Assistant Examiner* — Seyon Ali-Simah Punchbeddell
(74) *Attorney, Agent, or Firm* — Ling Wu; Stephen Yang; Ling and Yang Intellectual Property

(57) ABSTRACT

A display substrate, comprising: a first electrode layer, which is located on one side of a drive backplane and which comprises a plurality of first electrodes that are distributed in an array; a leakage cutoff layer, which is located on the side of the first electrode layer facing away from the drive backplane and is located between two adjacent first electrodes, the surface of the leakage cutoff layer on the side facing away from the drive backplane having a cutoff recess
(Continued)

and cutoff protrusions located on both sides of the cutoff recess; a light-emitting functional layer, which is located on the side of the leakage cutoff layer and the first electrode layer facing away from the drive backplane; and a second electrode layer, which is located on the side of the light-emitting functional layer facing away from the drive back-plane.

19 Claims, 9 Drawing Sheets

(51) Int. Cl.
    *H10K 59/35*         (2023.01)
    *H10K 59/80*         (2023.01)
    *H10K 71/00*         (2023.01)
    *H10K 102/00*       (2023.01)

(52) U.S. Cl.
    CPC ....... *H10K 59/35* (2023.02); *H10K 59/80518* (2023.02); *H10K 71/00* (2023.02); *H10K 2102/351* (2023.02)

(56) References Cited

U.S. PATENT DOCUMENTS

| | | | |
|---|---|---|---|
| 2015/0280164 A1* | 10/2015 | Lin ........................ | H10K 50/15 438/46 |
| 2016/0254331 A1 | 9/2016 | Wang | |
| 2016/0268354 A1 | 9/2016 | Xiong et al. | |
| 2017/0200773 A1 | 7/2017 | Li et al. | |
| 2019/0006443 A1 | 1/2019 | Hanashima et al. | |
| 2019/0165326 A1* | 5/2019 | Kim ..................... | H10K 59/878 |
| 2020/0212119 A1* | 7/2020 | Shim ..................... | H10K 59/35 |
| 2021/0066416 A1 | 3/2021 | Yang et al. | |
| 2021/0217980 A1* | 7/2021 | Yang ................... | H10K 50/828 |

FOREIGN PATENT DOCUMENTS

| | | |
|---|---|---|
| CN | 105448825 A | 3/2016 |
| CN | 109216413 A | 1/2019 |
| CN | 110459699 A | 11/2019 |
| CN | 110993806 A | 4/2020 |
| CN | 111668381 A | 9/2020 |
| CN | 111668382 A | 9/2020 |
| CN | 212342660 U | 1/2021 |

OTHER PUBLICATIONS

International Search Report for PCT/CN2021/093943 Mailed Aug. 13, 2021.
Office Action dated Jan. 21, 2022 for Chinese Patent Application No. 202010565939.8 and English Translation.

* cited by examiner 41   422   421

4

210   8   1

4

325
324
323   32
322
321

33

315
314   31
313
312
311

21

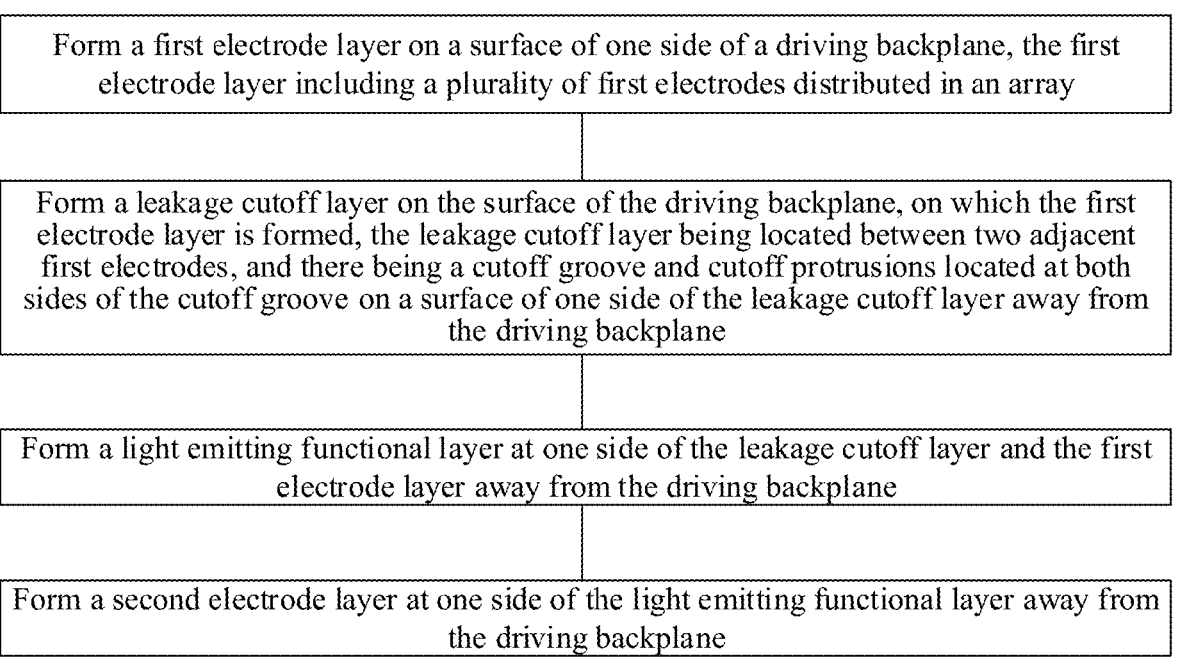

Form a first electrode layer on a surface of one side of a driving backplane, the first electrode layer including a plurality of first electrodes distributed in an array Form a leakage cutoff layer on the surface of the driving backplane, on which the first electrode layer is formed, the leakage cutoff layer being located between two adjacent first electrodes, and there being a cutoff groove and cutoff protrusions located at both sides of the cutoff groove on a surface of one side of the leakage cutoff layer away from the driving backplane Form a light emitting functional layer at one side of the leakage cutoff layer and the first electrode layer away from the driving backplane Form a second electrode layer at one side of the light emitting functional layer away from the driving backplane

FIG. 12

DISPLAY SUBSTRATE FOR AVOIDING LATERAL LEAKAGE AND PREPARATION METHOD THEREFOR, AND DISPLAY APPARATUS

CROSS-REFERENCE TO RELATED APPLICATION

This application is a national stage application of PCT Application No. PCT/CN2021/093943, which is filed on May 14, 2021 and claims priority to Chinese Patent Application No. 202010565939.8, entitled "Display Substrate and Preparation Method Therefor, and Display Apparatus" and filed with the CNIPA on Jun. 19, 2020, the content of which is incorporated herein by reference in its entirety.

TECHNICAL FIELD

The present disclosure relates to, but is not limited to, the field of display technology, and particularly, to a display substrate and a preparation method therefor, and a display apparatus.

BACKGROUND

In recent years, as near-eye displays, silicon-based Organic Light-Emitting Diode (OLED) micro displays are often used in the field of Virtual Reality (VR)/Augmented Reality (AR). The silicon-based semiconductor process is mature and has high integration, enabling ultra-high pixels per inch (PPI) display.

It is found in use that there is cross color or crosstalk in silicon-based OLED micro displays, which affects the color gamut of the displays and decreases the quality and color purity of the displays.

SUMMARY

The following is a summary about the subject matter described herein in detail. The summary is not intended to limit the protection scope of the claims.

In a first aspect, an embodiment of the present disclosure provides a display substrate, including:

a driving backplane;

a first electrode layer located at one side of the driving backplane, the first electrode layer including a plurality of first electrodes distributed in an array;

a leakage cutoff layer located at one side of the first electrode layer away from the driving backplane, the leakage cutoff layer being located between two adjacent first electrodes, and there being a cutoff groove and cutoff protrusions located at both sides of the cutoff groove on a surface of one side of the leakage cutoff layer away from the driving backplane;

a light emitting functional layer located at one side of the leakage cutoff layer and the first electrode layer away from the driving backplane; and a second electrode layer located at one side of the light emitting functional layer away from the driving backplane.

In some possible implementations, the first electrode includes a flat middle portion and a climbing portion surrounding the middle portion, the second electrode layer includes a plurality of gentle portions corresponding to the middle portions and connecting portions located between two adjacent gentle portions, and in a direction perpendicular to the driving backplane, the thickness of the light emitting functional layer located between the gentle portion and the middle portion is d0, the minimum distance between the cutoff protrusion and the middle portion is d1, and a ratio of d1 to d0 ranges from 0.3 to 0.8.

In some possible implementations, a distance between the cutoff groove and the cutoff protrusion in the direction perpendicular to the driving backplane is d2, and a ratio of d2 to d0 ranges from 0.1 to 0.4.

In some possible implementations, the leakage cutoff layer has a cutoff side surface facing the first electrode, the leakage cutoff layer shrinks from the driving backplane towards a direction away from the driving backplane, and an angle between the cutoff side surface and a surface of one side of the leakage cutoff layer facing the driving backplane is 60 to 90°.

In some possible implementations, the leakage cutoff layer has a cutoff side surface facing the first electrode, the leakage cutoff layer expands from the driving backplane towards a direction away from the driving backplane, and an angle between the cutoff side surface and a surface of one side of the leakage cutoff layer facing the driving backplane is 90 to 120°.

In some possible implementations, the first electrode includes a flat middle portion and a climbing portion surrounding the middle portion, and an orthographic projection of the leakage cutoff layer on the driving backplane is between orthographic projections of two adjacent middle portions on the driving backplane.

In some possible implementations, the first electrode includes a flat middle portion and a climbing portion surrounding the middle portion, and an orthographic projection of the leakage cutoff layer on the driving backplane at least overlaps with an orthographic projection of the middle portion located at one side of the leakage cutoff layer on the driving backplane.

In some possible implementations, in the direction perpendicular to the driving backplane, a distance between the cutoff protrusion and the middle portion is d1, the thickness of the middle portion is d3, and a ratio of d3 to d1 is 2 to 4.

In some possible implementations, in the direction perpendicular to the driving backplane, the thickness of the light emitting functional layer located between the gentle portion and the middle portion is d0, the depth of the cutoff groove is d2, and a ratio of d2 to d0 is 0.2 to 0.8.

In some possible implementations, the depth of the cutoff groove is greater than or equal to the thickness of the middle portion.

In some possible implementations, the light emitting functional layer includes a first light emitting unit layer, a charge generation layer and a second light emitting unit layer which are sequentially stacked from the first electrode layer towards the second electrode layer, and the first light emitting unit layer includes a first hole injection layer, a first hole transport layer, a first light emitting layer, a second light emitting layer and a first electron transport layer which are sequentially stacked from the first electrode layer towards the second electrode layer.

In some possible implementations, the light emitting functional layer includes a first light emitting unit layer, a charge generation layer and a second light emitting unit layer which are sequentially stacked from the first electrode layer towards the second electrode layer, and the second light emitting unit layer includes a second hole injection layer, a second hole transport layer, a third light emitting layer, a second electron transport layer and a second electron injection layer which are sequentially stacked from the first electrode layer towards the second electrode layer.

In some possible implementations, the thickness of the charge generation layer is 100 angstroms to 200 angstroms.

In some possible implementations, the thickness of the first hole injection layer is 70 angstroms to 130 angstroms; or the thickness of the first hole transport layer is 70 angstroms to 130 angstroms; or the thickness of the first light emitting layer is 70 angstroms to 130 angstroms; or the thickness of the second light emitting layer is 250 angstroms to 350 angstroms; or the thickness of the first electron transport layer is 150 angstroms to 250 angstroms.

In some possible implementations, the first light emitting layer is a red light emitting layer and the second light emitting layer is a green light emitting layer.

In some possible implementations, the thickness of the second hole injection layer is 70 angstroms to 130 angstroms; or the thickness of the second hole transport layer is 70 angstroms to 130 angstroms; or the thickness of the third light emitting layer is 200 angstroms to 300 angstroms; or the thickness of the second electron transport layer is 250 angstroms to 350 angstroms; or the thickness of the second electron injection layer is 800 angstroms to 1000 angstroms.

In some possible implementations, the third light emitting layer is a blue light emitting layer.

In some possible implementations, the connecting portion includes a convex portion and concave portions located at both sides of the convex portion, the convex portion protrudes towards a side away from the driving backplane, and the concave portion is recessed towards a side of the driving backplane, the concave portion connects the convex portion with the gentle portion, and a distance between a position of the concave portion closest to the driving backplane and the middle portion in the direction perpendicular to the driving backplane is 100 nm to 300 nm.

In some possible implementations, a distance between the position of the concave portion closest to the driving backplane and a surface of one side of the gentle portion facing the driving backplane in the direction perpendicular to the driving backplane is less than 60 nm.

In another aspect, an embodiment of the present disclosure further provides a method for preparing a display substrate, including:

forming a first electrode layer on a surface of one side of a driving backplane, the first electrode layer including a plurality of first electrodes distributed in an array;

forming a leakage cutoff layer on the surface of the driving backplane, on which the first electrode layer is formed, the leakage cutoff layer being located between two adjacent first electrodes, and there being a cutoff groove and cutoff protrusions located at both sides of the cutoff groove on a surface of one side of the leakage cutoff layer away from the driving backplane;

forming a light emitting functional layer at one side of the leakage cutoff layer and the first electrode layer away from the driving backplane; and forming a second electrode layer at one side of the light emitting functional layer away from the driving backplane.

In still another aspect, an embodiment of the present disclosure further provides a display apparatus, including the display substrate described above.

Other features and advantages of technical schemes of the present disclosure will be elaborated in the following specification and become apparent partially from the specification or are understood by implementing the technical schemes of the present disclosure. The objects and advantages of the technical schemes of the present disclosure may be implemented and obtained through structures particularly pointed out in the specification and the drawings.

BRIEF DESCRIPTION OF DRAWINGS

Accompanying drawings are used for providing an understanding of the technical schemes of the present disclosure and form a part of the specification, are used for explaining the technical schemes of the present disclosure together with embodiments of the present disclosure, and do not constitute a limitation on the technical schemes of the present disclosure.

FIG. 12 is a schematic diagram of a method for preparing a display substrate in accordance with an exemplary embodiment.

DETAILED DESCRIPTION

Figure 1:
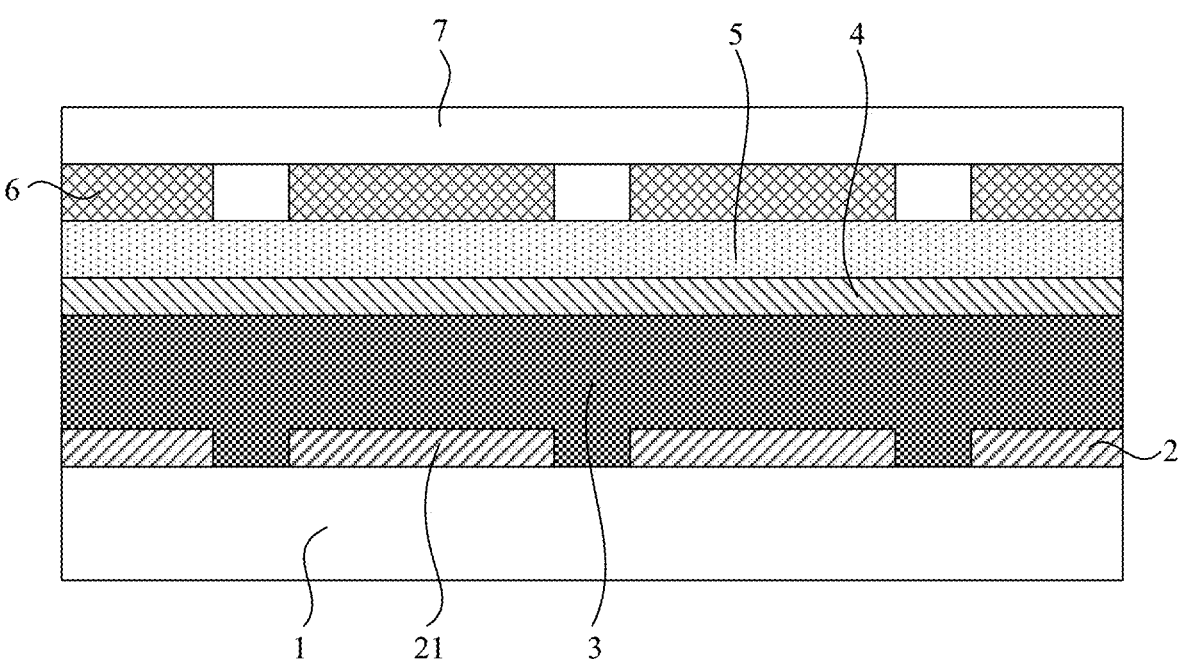
FIG. 1 is a schematic diagram of a structure of a silicon-based OLED display panel.

Embodiments of the present disclosure will be described in detail below in combination with the drawings. Their implementations may be carried out in many different forms. Those of ordinary skill in the art can easily understand such a fact that manners and contents may be transformed into various forms without departing from the purpose and scope of the present disclosure. Therefore, the present disclosure should not be interpreted as being limited to the contents recorded in the following implementations only. The embodiments in the present disclosure and features in the embodiments can be arbitrarily combined with each other without conflicts.

Sometimes for clarity, sizes of various constituent elements, thicknesses of layers or areas in the drawings may be exaggerated. Therefore, implementations of the present disclosure are not necessarily limited to the sizes, and the shapes and sizes of various components in the drawings do not reflect the true proportion. In addition, the drawings schematically illustrate ideal examples, and the implementations of the present disclosure are not limited to the shapes or numerical values shown in the drawings.

Ordinal numerals such as "first", "second", "third" and the like in the present disclosure are set to avoid confusion of the constituent elements, but not to set a limit in quantity.

For convenience, the terms such as "middle", "upper", "lower", "front", "back", "vertical", "horizontal", "top", "bottom", "inside", "outside" and the like indicating orientation or position relationships are used in the present disclosure to illustrate position relationships between the constituent elements with reference to the drawings, which are intended to facilitate description of the present disclosure and simplification of the description, but not to indicate or imply that the mentioned apparatus or element must have a specific orientation or be constructed and operated in a specific orientation. Therefore, they should not be understood as limitations to the present disclosure. The position relationships between the constituent elements change appropriately according to the direction in which the various constituent elements are described. Therefore, description is not limited to the words and phrases used in the specification, and appropriate substitutions may be made according to situations.

Unless otherwise specified and defined explicitly, the terms "installed", "coupled" and "connected" should be understood in a broad sense in the present disclosure. For example, the connection may be a fixed connection, a detachable connection or an integrated connection, or may be a mechanical connection or an electrical connection, or may be a direct connection, an indirect connection through intermediate components, or communication inside two components. For those of ordinary skill in the art, the meanings of the above terms in the present disclosure can be understood according to situations.

In the present disclosure, a transistor refers to an element which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current can flow through the drain electrode, the channel region and the source electrode. In the present disclosure, the channel region refers to a region which the current flows mainly through.

In the present disclosure, it may be the case that the first pole is a drain electrode and the second pole is a source electrode, and it also may be the case that the first pole is a source electrode and the second pole is a drain electrode. In the case that transistors with opposite polarities are used or that a current direction is changed during circuit operation, functions of "the source electrode" and "the drain electrode" may sometimes be exchanged. Therefore, "the source electrode" and "the drain electrode" may be exchanged in the present disclosure.

In the present disclosure, "electrical connection" includes a case in which the constituent elements are connected together through an element with a certain electric action. The "element with a certain electric action" is not particularly limited as long as it allows sending and receiving of electric signals between the connected constituent elements. Examples of the "element with a certain electric action" include not only an electrode and wiring, but also a switching element such as a transistor, a resistor, an inductor, a capacitor, other elements with various functions, etc.

In the present disclosure, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

"Thickness" mentioned herein refers to a dimension of a film layer in a direction perpendicular to the driving backplane.

FIG. 1 is a schematic diagram of a structure of a silicon-based OLED display panel. As shown in FIG. 1, the silicon-based OLED display panel includes a driving backplane 1, a first electrode layer 2, a light emitting functional layer 3, a second electrode layer 4, an encapsulation layer 5, a color filter layer 6 and a cover plate 7. The driving backplane 1 may be a silicon-based backplane. The first electrode layer 2 is located at one side of the driving backplane 1. The first electrode layer 2 may include a plurality of first electrodes 21 arranged in an array. The light emitting functional layer 3 is located at one side of the first electrode layer 2 away from the driving backplane 1. The second electrode layer 4 is located at one side of the light emitting functional layer 3 away from the driving backplane 1. The encapsulation layer 5 is located at one side of the second electrode layer 4 away from the driving backplane 1. The color filter layer 6 is located at one side of the encapsulation layer 5 away from the driving backplane 1, and the cover plate 7 is located at one side of the color filter layer 6 away from the driving backplane 1. The first electrodes 21 may form a pixel together with the light emitting functional layer 3 and the second electrode layer 4 above the first electrode 21.

The silicon-based OLED display panel is small in size and can realize ultra-high PPI display. In the silicon-based OLED display panel, a gap between adjacent first electrodes 21 is only 0.3 μm (micrometer) to 2 μm. The light emitting functional layer 3 includes a plurality of organic layers, such as a hole injection layer, a hole transport layer, an organic light emitting layer, an electron transport layer and the like. For a series-connected OLED device, the light emitting functional layer 3 may further include a charge generation layer. In the silicon-based OLED display panel, whole-surface evaporation is used for the preparation of the light emitting functional layer 3, that is, the organic layers between adjacent pixels are connected. Since the hole injection layer and the charge generation layer have relatively good conductivity, in a one pixel working state (that is, one pixel emits light), a current will transmit from the first electrode 21 to other adjacent pixels through the hole injection layer or the charge generation layer, resulting in lateral leakage. Pixels of the display panel are arranged at intervals, and when a certain pixel emits light, its adjacent pixels will also emit weak light due to lateral leakage, resulting in the phenomenon of concomitant light emitting or crosstalk, thereby affecting the color gamut of a display and decreases the quality and color purity of the display.

Figure 2:
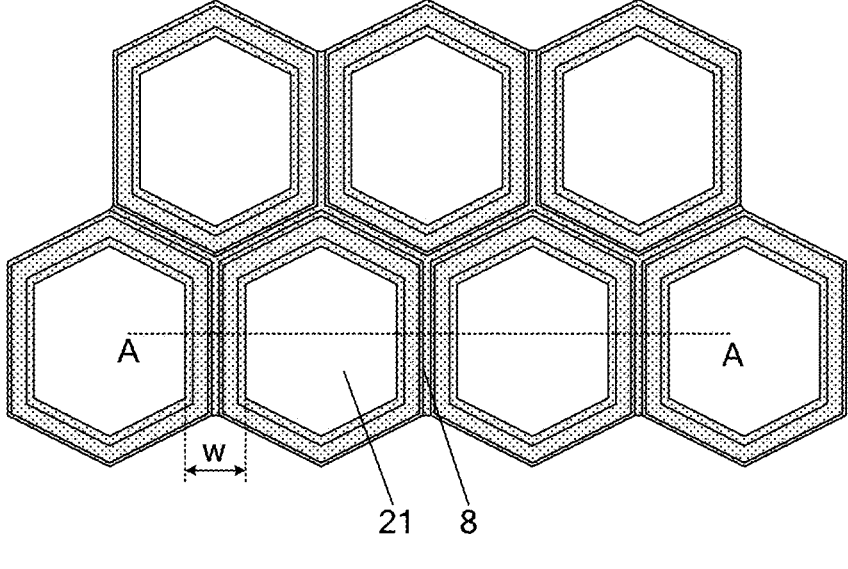
FIG. 2 is a schematic diagram of a planar structure of a display substrate in an exemplary embodiment of the present disclosure.
Figure 3:
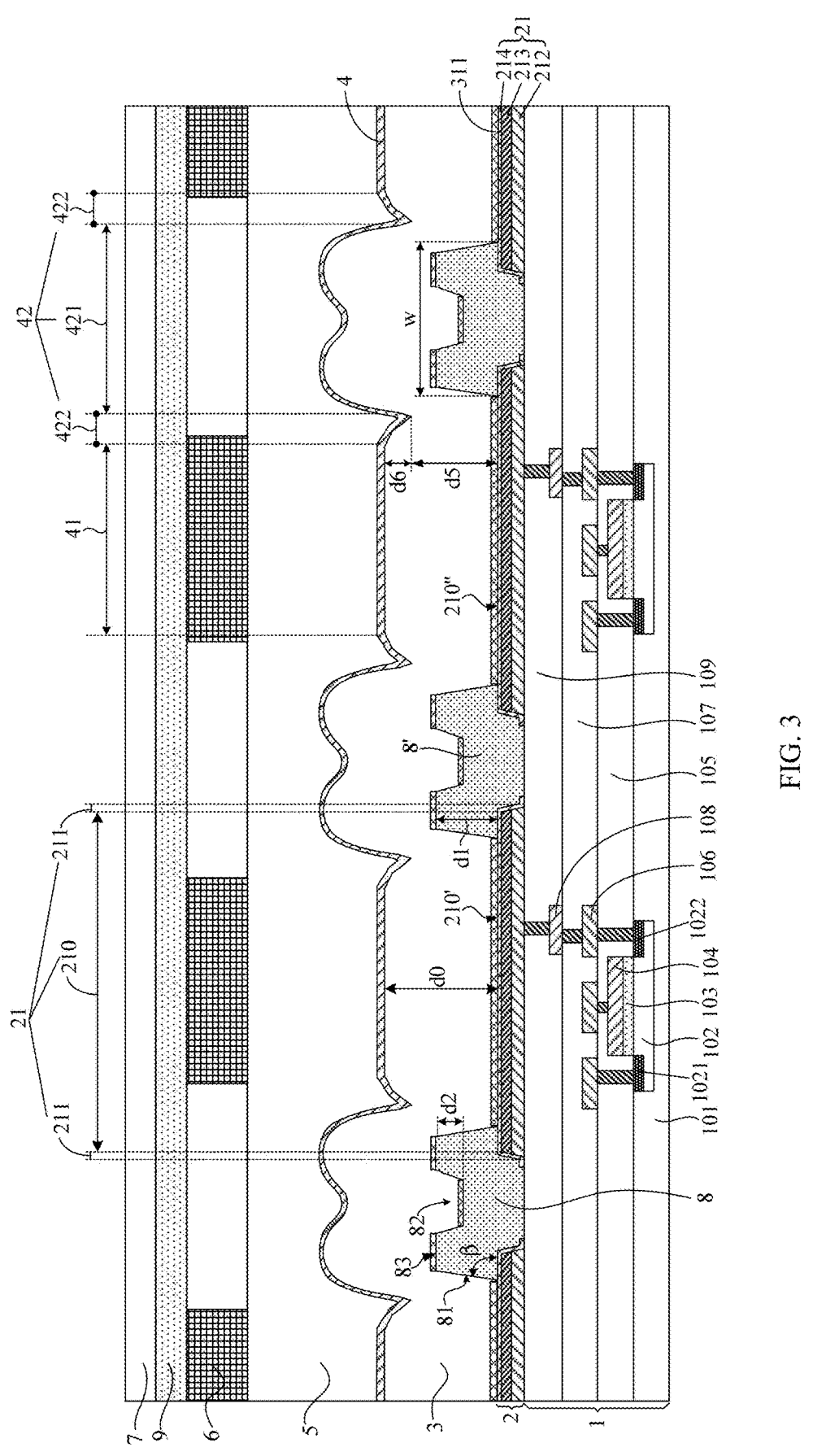
FIG. 3 is a schematic diagram of a structure of an A-A section of the display substrate shown in FIG. 2 in an exemplary embodiment.

FIG. 2 is a schematic diagram of a planar structure of a display substrate in an exemplary embodiment of the present disclosure. Only partial structures of a first electrode layer 2 and a leakage cutoff layer 8 are shown in FIG. 2. FIG. 3 is a schematic diagram of a structure of an A-A section of the display substrate shown in FIG. 2 in an exemplary embodiment. In an exemplary embodiment, as shown in FIG. 3, the display substrate includes a driving backplane 1, a first electrode layer 2, a leakage cutoff layer 8, a light emitting functional layer 3 and a second electrode layer 4.

The first electrode layer 2 is located at one side of the driving backplane 1. The first electrode layer 2 includes a plurality of first electrodes 21 distributed in an array. The first electrode 21 includes a flat middle portion 210 and a climbing portion 211 surrounding the middle portion 210.

The leakage cutoff layer 8 is located at one side of the first electrode layer 2 away from the driving backplane 1. The leakage cutoff layer 8 is located between two adjacent first electrodes 21. There are a cutoff groove 82 and cutoff protrusions 83 located at both sides of the cutoff groove 82 on a surface of one side of the leakage cutoff layer 8 away from the driving backplane 1.

The light emitting functional layer 3 is located at one side of the leakage cutoff layer 8 and the first electrode layer 2 away from the driving backplane.

The second electrode layer 4 is located at one side of the light emitting functional layer 3 away from the driving backplane 1, and the second electrode layer 4 is a continuous film layer.

In the display substrate in accordance with an embodiment of the present disclosure, the first electrode 21 may form a light emitting pixel together with the light emitting functional layer and the second electrode layer located in an area, in which the first electrode 21 is located. The display substrate is provided with a leakage cutoff layer 8 and there are a cutoff groove 82 and cutoff protrusions 83 located at both sides of the cutoff groove 82 on a surface of one side of the leakage cutoff layer 8 away from the driving backplane 1, so that at the time of performing whole-surface evaporation on the light emitting functional layer 3, a first hole injection layer 311 of the light emitting functional layer 3 may be cut off by the leakage cutoff layer 8, so that the first hole injection layers 311 located at both sides of the leakage cutoff layer 8 are disconnected from each other. Therefore, in a one pixel working state (that is, one pixel emits light), the current will not transmit from the first electrode to other adjacent pixels through the first hole injection layer, thereby avoiding lateral leakage, avoiding the phenomenon of concomitant light emitting or crosstalk, improving the color gamut of a display and improving the quality and color purity of the display.

In an exemplary embodiment, as shown in FIG. 2, the first electrode 21 is in the shape of a hexagon. In other embodiments, the first electrode may be in other shapes, for example, in the shape of any one of a quadrilateral, an octagon, a circle, etc. The shape of the first electrode may be determined according to actual needs, which is not limited herein.

In an exemplary embodiment, the second electrode layer 4 overlies the light emitting functional layer 3, and a driving signal may be applied to the first electrode 21 and the second electrode layer 4, so that a portion of the light emitting functional layer 3 between the first electrode 21 and the second electrode layer 4 emits light.

As shown in FIG. 3, the first electrode 21 includes a flat middle portion 210 and a climbing portion 211 surrounding the middle portion 210. The second electrode layer 4 includes a plurality of gentle portions 41 and connecting portions 42 located between two adjacent gentle portions 41.

The plurality of gentle portions 41 are distributed in an array and arranged in one-to-one correspondence with the middle portions 210 of the first electrodes 21. An orthographic projection of the gentle portion 41 on the driving backplane is within a range of an orthographic projection of the middle portion 210 on the driving backplane. The gentle portion 41 is parallel or approximately parallel to the middle portion 210.

As shown in FIG. 3, the connecting portion 42 includes a convex portion 421 and concave portions 422 located at both sides of the convex portion 421. The convex portion 421 protrudes towards a side away from the driving backplane, the concave portion 422 connects the convex portion 421 with the gentle portion 41, and the concave portion 422 is recessed towards a side of the driving backplane.

In an exemplary embodiment, as shown in FIG. 3, the thickness of the light emitting functional layer 3 located between the gentle portion 41 and the middle portion 210 in the direction perpendicular to the driving backplane is d0. The minimum distance between the cutoff protrusion 83 and the middle portion 210 of the first electrode 21 in the direction perpendicular to the driving backplane is d1. A ratio of d1 to d0 ranges from 0.3 to 0.8. For example, the ratio of d1 to d0 may be any one of 0.3, 0.4, 0.5, 0.6, 0.7 and 0.8. In an exemplary embodiment, d1 may be 1500 angstroms to 2000 angstroms. A distance between the cutoff groove 82 and the cutoff protrusion 83 in the direction perpendicular to the driving backplane is d2. A ratio of d2 to d0 ranges from 0.1 to 0.4. For example, the ratio of d2 to d0 may be one of 0.1, 0.2, 0.3 and 0.4. Such an arrangement mode may ensure that the first hole injection layer 311 is cut off by the leakage cutoff layer.

The surface of the cutoff protrusion 83 shown in FIG. 3 is a flat surface. However, the surface of the cutoff protrusion 83 is not limited to a flat surface, but may be any one of an arc-shaped surface, a concave-convex surface, etc., as long as the cutoff protrusion 83 protrudes as a whole towards the direction away from the driving backplane.

The bottom surface of the cutoff groove 82 shown in FIG. 3 is a flat surface. However, the bottom surface of the cutoff groove 82 is not limited to a flat surface, but may be any one of an arc-shaped surface, a concave-convex surface, etc., as long as the cutoff groove 82 is recessed as a whole towards the driving backplane.

In an exemplary embodiment, as shown in FIG. 3, an orthographic projection of the leakage cutoff layer 8 on the driving backplane 1 at least overlaps with an orthographic projection of the middle portion 210 located at one side of the leakage cutoff layer 8 on the driving backplane 1. For example, in FIG. 3, for a leakage cutoff layer 8', a middle portion 210' on the left of the leakage cutoff layer 8' and a middle portion 210" on the right of the leakage cutoff layer 8', the orthographic projection of the leakage cutoff layer 8' on the driving backplane 1 at least overlaps with the orthographic projection of the middle portion 210' on the driving backplane 1, or the orthographic projection of the leakage cutoff layer 8' on the driving backplane 1 at least overlaps with the orthographic projection of the middle portion 210" on the driving backplane 1. The leakage cutoff layer 8 laps over an upper surface of the middle portion 210 in this way, so that a height difference between the leakage cutoff layer 8 and the middle portion 210 can be increased. At the time of evaporating the hole injection layer, it is more conducive to cutoff of the hole injection layer by the leakage cutoff layer 8.

In an exemplary embodiment, as shown in FIG. 3, the orthographic projection of the leakage cutoff layer 8 on the driving backplane 1 overlaps with the orthographic projections of the middle portions 210 located at both sides of the leakage cutoff layer 8 on the driving backplane 1. For example, in FIG. 3, for the leakage cutoff layer 8', the middle portion 210' on the left of the leakage cutoff layer 8' and the middle portion 210'' on the right of the leakage cutoff layer 8', the orthographic projection of the leakage cutoff layer 8' on the driving backplane 1 overlaps with the orthographic projection of the middle portion 210' on the left of the leakage cutoff layer 8' on the driving backplane 1, and the orthographic projection of the leakage cutoff layer 8' on the driving backplane 1 overlaps with the orthographic projection of the middle portion 210'' on the right of the leakage cutoff layer 8' on the driving backplane 1.

In an exemplary embodiment, as shown in FIG. 3, the leakage cutoff layer 8 has a cutoff side surface 81 facing the first electrode 21. In an exemplary embodiment, as shown in FIG. 3, the leakage cutoff layer 8 can shrink from the driving backplane 1 towards a direction away from the driving backplane 1, and an angle β between the cutoff side surface 81 and the surface of one side of the leakage cutoff layer 8 facing the driving backplane is 60° to 90°. For example, β may be one of 60°, 65°, 70°, 75°, 80°, 85° and 90°. In another exemplary embodiment, the leakage cutoff layer 8 can expand from the driving backplane 1 towards a direction away from the driving backplane 1, and the angle β between the cutoff side surface 81 and the surface of one side of the leakage cutoff layer 8 facing the driving backplane is 90° to 120°. For example, β may be one of 90°, 95°, 100°, 105°, 110°, 115° and 120°.

In an exemplary embodiment, as shown in FIGS. 2 and 3, the maximum width w of the leakage cutoff layer 8 in a direction parallel to the driving backplane may be 0.3 μm to 1.5 μm. The width of the leakage cutoff layer 8 is not limited herein, and the width of the leakage cutoff layer 8 may be set according to actual needs. The width of the leakage cutoff layer is a dimension of the leakage cutoff layer in a direction perpendicular to its extension direction, as shown in FIG. 2.

In an exemplary embodiment, a material of the leakage cutoff layer 8 may include at least one of silicon oxide and silicon nitride. In an exemplary embodiment, the material of the leakage cutoff layer is an organic material, such as a resin material.

In an exemplary embodiment, the light emitting functional layer 3 may include a light emitting unit layer, which may include a hole injection layer, a hole transport layer, a light emitting layer, an electron transport layer and an electron injection layer which are sequentially stacked from the first electrode 21 towards the direction away from the driving backplane 1.

In an exemplary embodiment, a material of the second electrode layer 4 may be a transparent conductive material, such as at least one of indium tin oxide, indium zinc oxide and aluminum-doped zinc oxide (AZO). In an exemplary embodiment, the second electrode layer may be formed by depositing a conductive material on one side of the light emitting functional layer 3 away from the driving backplane by atomic layer deposition, so as to ensure that the second electrode layer 4 is a continuous film layer. Furthermore, forming the second electrode layer 4 by atomic layer deposition will not damage the light emitting functional layer. The thickness of the second electrode layer 4 may be 800 angstroms to 900 angstroms. For example, the thickness of the second electrode layer 4 may be any one of 800 angstroms, 810 angstroms, 820 angstroms, 830 angstroms, 840 angstroms, 850 angstroms, 860 angstroms, 870 angstroms, 880 angstroms, 890 angstroms and 900 angstroms.

Figure 4:
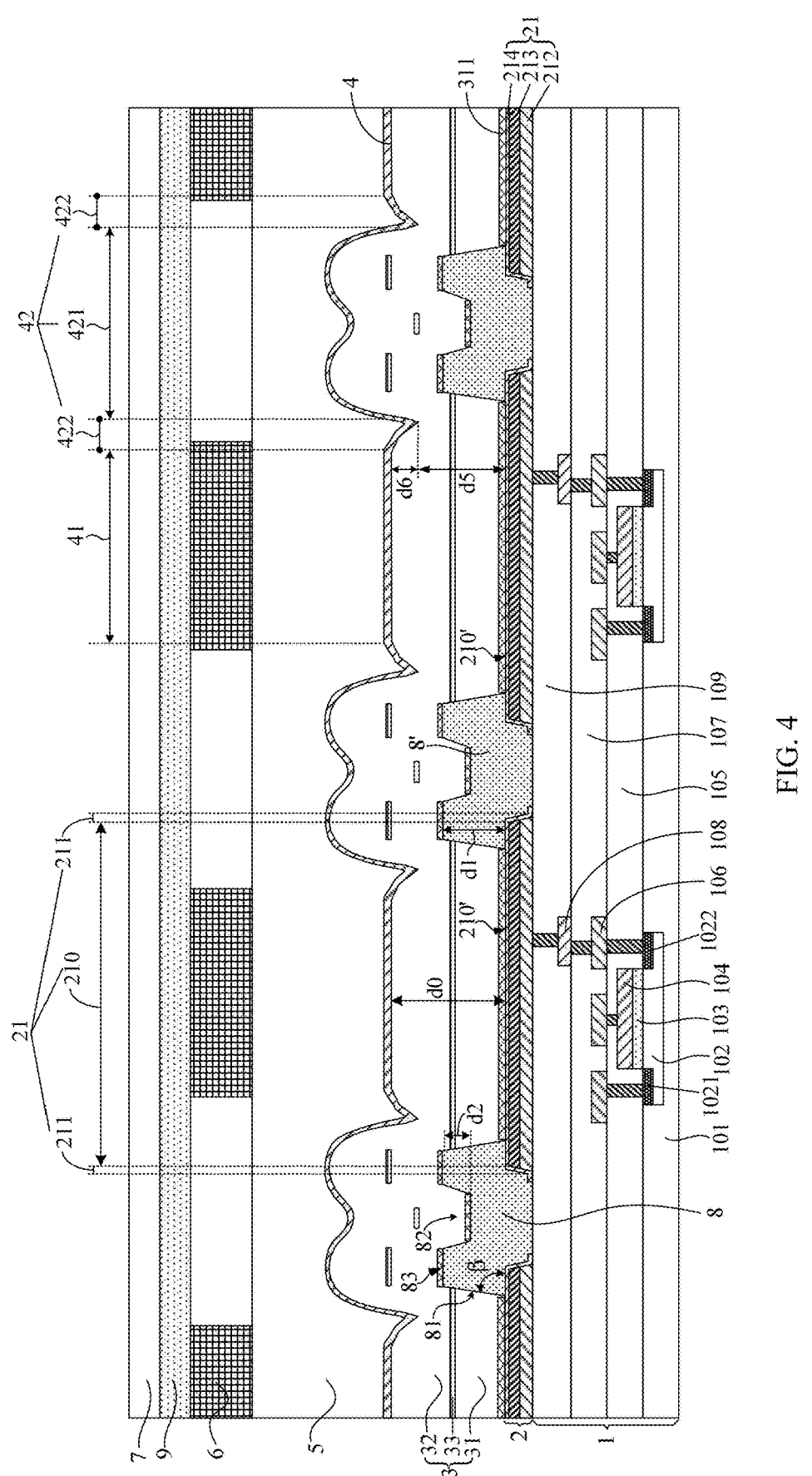
FIG. 4 is a schematic diagram of a structure of an A-A section of the display substrate shown in FIG. 2 in an exemplary embodiment.

FIG. 4 is a schematic diagram of a structure of an A-A section of the display substrate shown in FIG. 2 in an exemplary embodiment. In an exemplary embodiment, as shown in FIG. 4, the light emitting functional layer 3 may include a first light emitting unit layer 31, a charge generation layer 33 and a second light emitting unit layer 32 stacked from the first electrode layer 2 towards the second electrode layer 4. The charge generation layer 33 connects the first light emitting unit layer 31 with the second light emitting unit layer 32 in series. The first light emitting unit layer 31 includes a first hole injection layer 311. The first hole injection layers 311 located at both sides of the leakage cutoff layer 8 are disconnected from each other. The charge generation layers 33 located at both sides of the leakage cutoff layer 8 are disconnected from each other.

In an exemplary embodiment, as shown in FIG. 4, the thickness of the light emitting functional layer 3 located between the gentle portion 41 and the middle portion 210 in the direction perpendicular to the driving backplane is d0. The minimum distance between the cutoff protrusion 83 and the middle portion 210 of the first electrode 21 in the direction perpendicular to the driving backplane is d1. The ratio of d1 to d0 ranges from 0.3 to 0.8. For example, the ratio of d1 to d0 may be any one of 0.3, 0.4, 0.5, 0.6, 0.7 and 0.8. In an exemplary embodiment, d1 may be 1500 angstroms to 2000 angstroms. The maximum distance between the cutoff groove 82 and the cutoff protrusion 83 in the direction perpendicular to the driving backplane is d2. The ratio of d2 to d0 ranges from 0.1 to 0.4. For example, the ratio of d2 to d0 may be any one of 0.1, 0.2, 0.3 and 0.4. Such an arrangement mode may ensure that both the first hole injection layer 311 and the charge generation layer 33 are cut off by the leakage cutoff layer.

In the display substrate shown in FIG. 4, the charge generation layers 33 located at both sides of the leakage cutoff layer 8 are disconnected from each other, so that in a one pixel working state (that is, one pixel emits light), the current will not transmit to other adjacent pixels through the charge generation layer, thereby avoiding lateral leakage, avoiding the phenomenon of concomitant light emitting or crosstalk, improving the color gamut of a display and improving the quality and color purity of the display.

Figure 8:
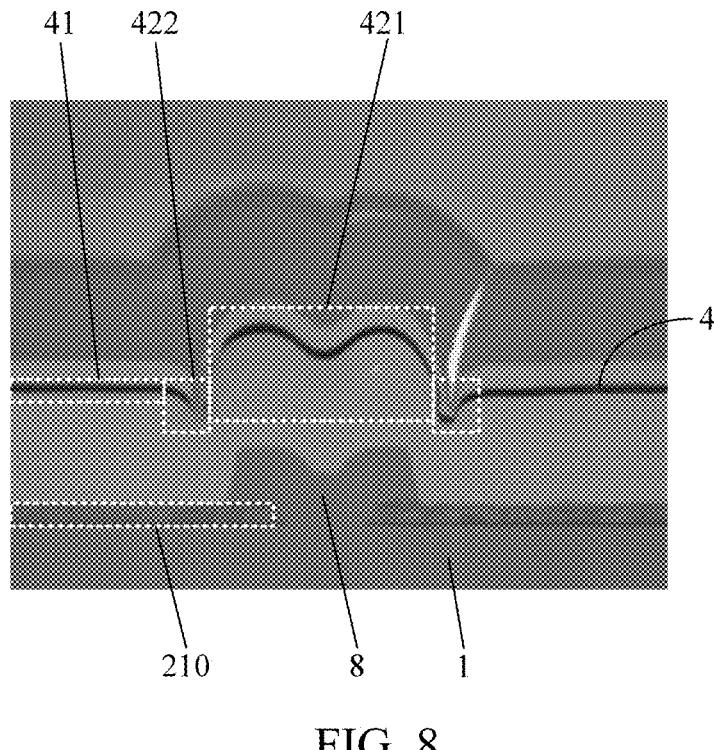
FIG. 8 is a local electron micrograph of the display substrate shown in FIG. 4.

FIG. 8 is a local electron micrograph of the display substrate shown in FIG. 4. As shown in FIG. 8, the orthogonal projection of the leakage cutoff layer 8 on the driving backplane 1 overlaps with the orthogonal projection of the middle portion 210 on the driving backplane 1. The second electrode layer 4 includes gentle portions 41 and connecting portions 42. The connecting portion 42 includes a convex portion 421 and a concave portion 422 located at both sides of the convex portion 421. The convex portion 421 protrudes towards a side away from the driving backplane, the concave portion 422 connects the convex portion 421 with the gentle portion 41, and the concave portion 422 is recessed towards a side of the driving backplane.

It may be understood by those skilled in the art that the light emitting functional layer 3 may be integrally evaporated using a large-opening mask at one side of the leakage cutoff layer 8 away from the driving backplane, and the second electrode layer 4 is deposited on one side of the light emitting functional layer 3 away from the driving backplane, so the shape of the formed light emitting functional layer matches the shapes of upper surfaces of the leakage cutoff layer and the first electrode layer, and the shape of the second electrode layer 4 matches the shape of the upper surface of the light emitting functional layer.

Figure 5:
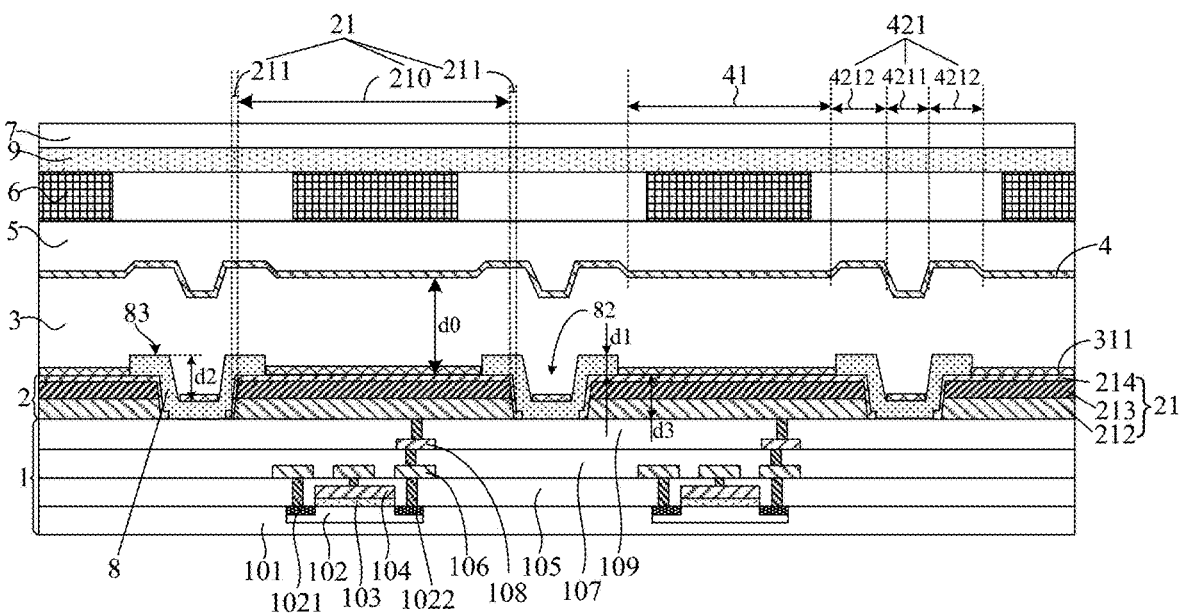
FIG. 5 is a schematic diagram of a structure of an A-A section of the display substrate shown in FIG. 2 in an exemplary embodiment.

FIG. 5 is a schematic diagram of a structure of an A-A section of the display substrate shown in FIG. 2 in an exemplary embodiment. In an exemplary embodiment, as shown in FIG. 5, in the direction perpendicular to the driving backplane, the distance between the cutoff protrusion 83 and the middle portion 210 of the first electrode 21 is d1, and the thickness of the middle portion 210 is d3. A ratio of d3 to d1 is 2 to 4. For example, the ratio of d3 to d1 may be any one of 2, 2.5, 3, 3.5 and 4. In an exemplary embodiment, the thickness of the middle portion 210 is 1000 angstroms to 1800 angstroms, and the thickness of the cutoff protrusion 83 (i.e., d1) is 300 angstroms to 800 angstroms. For example, the thickness of the middle portion 210 may be any one of 1000 angstroms, 1100 angstroms, 1200 angstroms, 1300 angstroms, 1400 angstroms, 1500 angstroms, 1600 angstroms, 1700 angstroms and 1800 angstroms; and the thickness of the cutoff protrusion 83 may be any one of 300 angstroms, 400 angstroms, 500 angstroms, 600 angstroms, 700 angstroms and 800 angstroms. The thickness of the middle portion and the thickness of the leakage cutoff layer lapping over the surface of the middle portion shall be selected such that the ratio of the thickness of the middle portion 210 to the thickness of the leakage cutoff layer lapping over the surface of the middle portion 210 is 2 to 4.

In an exemplary embodiment, as shown in FIG. 5, in the direction perpendicular to the driving backplane, the thickness of the light emitting functional layer 3 located between the gentle portion 41 and the middle portion 210 is d0, and the distance between the cutoff groove 82 and the cutoff protrusion 83 (that is, the depth of the cutoff groove 82) is d2. The ratio of d2 to d0 ranges from 0.2 to 0.8. For example, the ratio of d2 to d0 may be any one of 0.2, 0.25, 0.3, 0.35, 0.4, 0.45, 0.5, 0.55, 0.6, 0.65, 0.7, 0.75 and 0.8.

In an exemplary embodiment, as shown in FIG. 5, the depth d2 of the cutoff groove 82 is greater than or equal to the thickness d3 of the middle portion.

In an exemplary embodiment, as shown in FIG. 5, the connecting portion includes a convex portion 421. The convex portion 421 includes a sub-concave portion 4211 and sub-convex portions 4212 located at both sides of the sub-concave portion 4211. The sub-concave portion 4211 corresponds to the cutoff groove 82, and the sub-convex portion 4212 corresponds to the cutoff protrusion 83. The sub-concave portion 4211 is recessed towards a side of the driving backplane relative to the gentle portion 41, the sub-convex portion 4212 connects the sub-concave portion 4211 with the gentle portion 41, and the sub-convex portion 4212 protrudes towards a side away from the driving backplane relative to the gentle portion 41.

Figure 6:
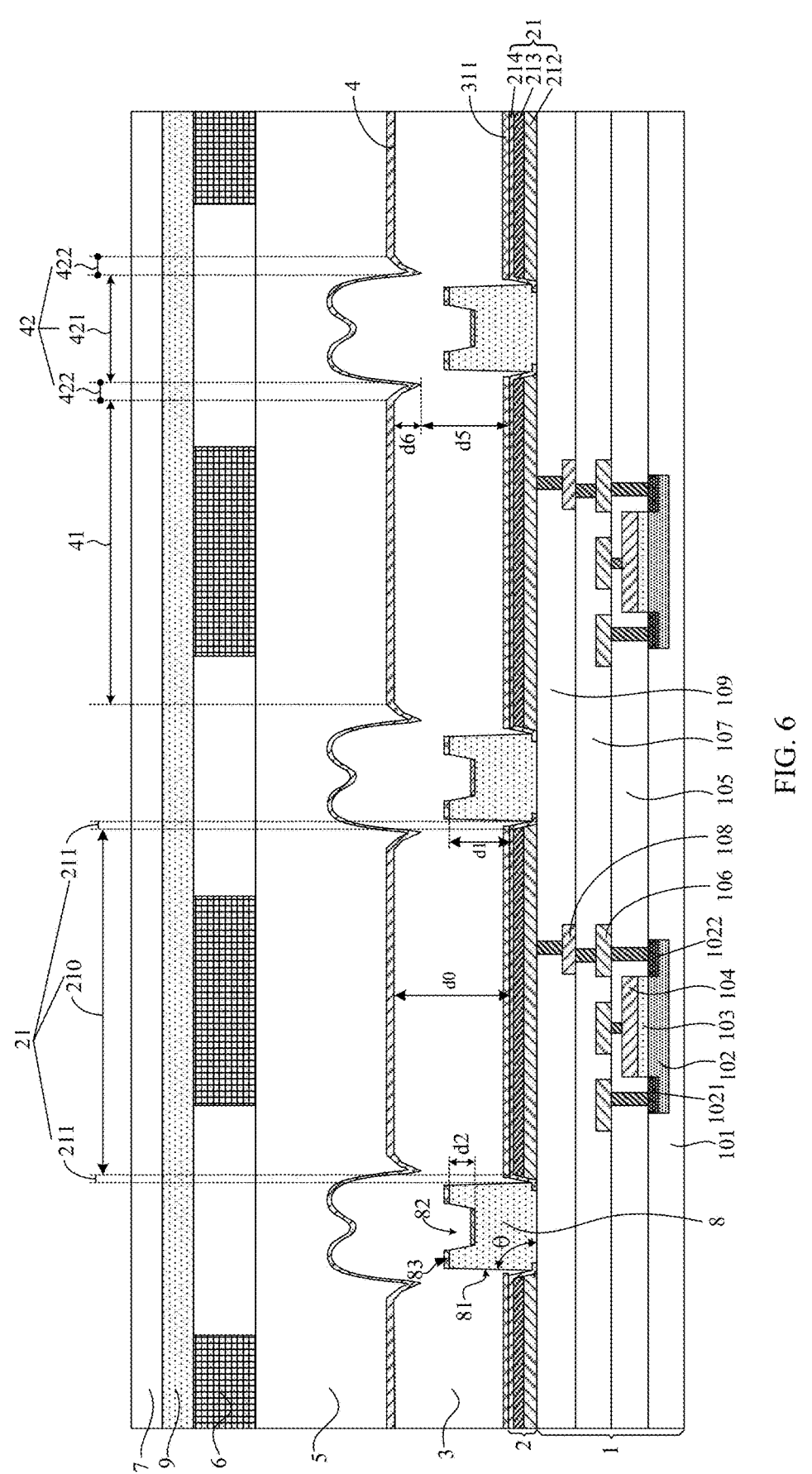
FIG. 6 is a schematic diagram of a structure of an A-A section of the display substrate shown in FIG. 2 in an exemplary embodiment.

FIG. 6 is a schematic diagram of a structure of an A-A section of the display substrate shown in FIG. 2 in an exemplary embodiment. In an exemplary embodiment, as shown in FIG. 6, the first electrode 21 includes a flat middle portion 210 and a climbing portion 211 surrounding the middle portion 210. The orthographic projection of the leakage cutoff layer 8 on the driving backplane 1 is between the orthographic projections of two adjacent middle portions 210 on the driving backplane 1. That is, the orthographic projection of the leakage cutoff layer 8 on the driving backplane 1 does not overlap with the orthographic projection of the middle portion 210 on the driving backplane 1.

As shown in FIG. 6, the second electrode layer 4 includes a plurality of gentle portions 41 and connecting portions 42 located between two adjacent gentle portions 41. The plurality of gentle portions 41 are distributed in an array and arranged in one-to-one correspondence with the middle portions 210 of the first electrodes 21. The orthographic projection of the gentle portion 41 on the driving backplane is within the range of the orthographic projection of the middle portion 210 on the driving backplane. The gentle portion 41 is parallel or approximately parallel to the middle portion 210.

As shown in FIG. 6, the connecting portion 42 includes a convex portion 421 and concave portions 422 located at both sides of the convex portion 421. The convex portion 421 protrudes towards a side away from the driving backplane relative to the gentle portion 41, the concave portion 422 connects the convex portion 421 with the gentle portion 41, and the concave portion 422 is recessed towards a side of the driving backplane relative to the gentle portion 41.

In an exemplary embodiment, as shown in FIG. 6, the thickness of the light emitting functional layer 3 located between the gentle portion 41 and the middle portion 210 in the direction perpendicular to the driving backplane is d0. The maximum distance between the cutoff protrusion 83 and the middle portion 210 of the first electrode 21 in the direction perpendicular to the driving backplane is d1. The ratio of d1 to d0 ranges from 0.3 to 0.8. For example, the ratio of d1 to d0 may be any one of 0.3, 0.4, 0.5, 0.6, 0.7 and 0.8. In an exemplary embodiment, d1 may be 1500 angstroms to 2000 angstroms. The maximum distance between the cutoff groove 82 and the cutoff protrusion 83 in the direction perpendicular to the driving backplane is d2. The ratio of d2 to d0 ranges from 0.1 to 0.4. For example, the ratio of d2 to d0 may be any one of 0.1, 0.2, 0.3 and 0.4. Such an arrangement mode may ensure that the first hole injection layer 311 is cut off by the leakage cutoff layer.

The surface of the cutoff protrusion 83 shown in FIG. 6 is a flat surface. However, the surface of the cutoff protrusion 83 is not limited to a flat surface, but may be one of an arc-shaped surface, a concave-convex surface, etc., as long as the surface of the cutoff protrusion 83 protrudes as a whole towards the direction away from the driving backplane.

The bottom surface of the cutoff groove 82 shown in FIG. 6 is a flat surface. However, the bottom surface of the cutoff groove 82 is not limited to a flat surface, but may be one of an arc-shaped surface, a concave-convex surface, etc., as long as the cutoff groove is recessed as a whole towards the driving backplane.

In an exemplary embodiment, as shown in FIG. 6, the leakage cutoff layer 8 has a cutoff side surface 81 facing the first electrode 21. In an exemplary embodiment, as shown in FIG. 6, the leakage cutoff layer 8 may shrink from the driving backplane 1 towards the direction away from the driving backplane 1, and an angle θ between the cutoff side surface 81 and a surface of one side of the leakage cutoff layer 8 facing the driving backplane is 60° to 90°. For example, θ may be any one of 60°, 65°, 70°, 75°, 80°, 85° and 90°. In another exemplary embodiment, the leakage cutoff layer 8 may expand from the driving backplane 1 towards the direction away from the driving backplane 1, and the angle θ between the cutoff side surface 81 and the surface of one side of the leakage cutoff layer 8 facing the driving backplane is 90° to 120°. For example, θ may be one of 90°, 95°, 100°, 105°, 110°, 115° and 120°.

In an exemplary embodiment, as shown in FIG. 6, the light emitting functional layer 3 includes a light emitting unit layer, which may include a hole injection layer, a hole transport layer, a light emitting layer, an electron transport layer and an electron injection layer which are sequentially stacked from the first electrodes 21 towards the direction away from the driving backplane 1.

Figure 7:
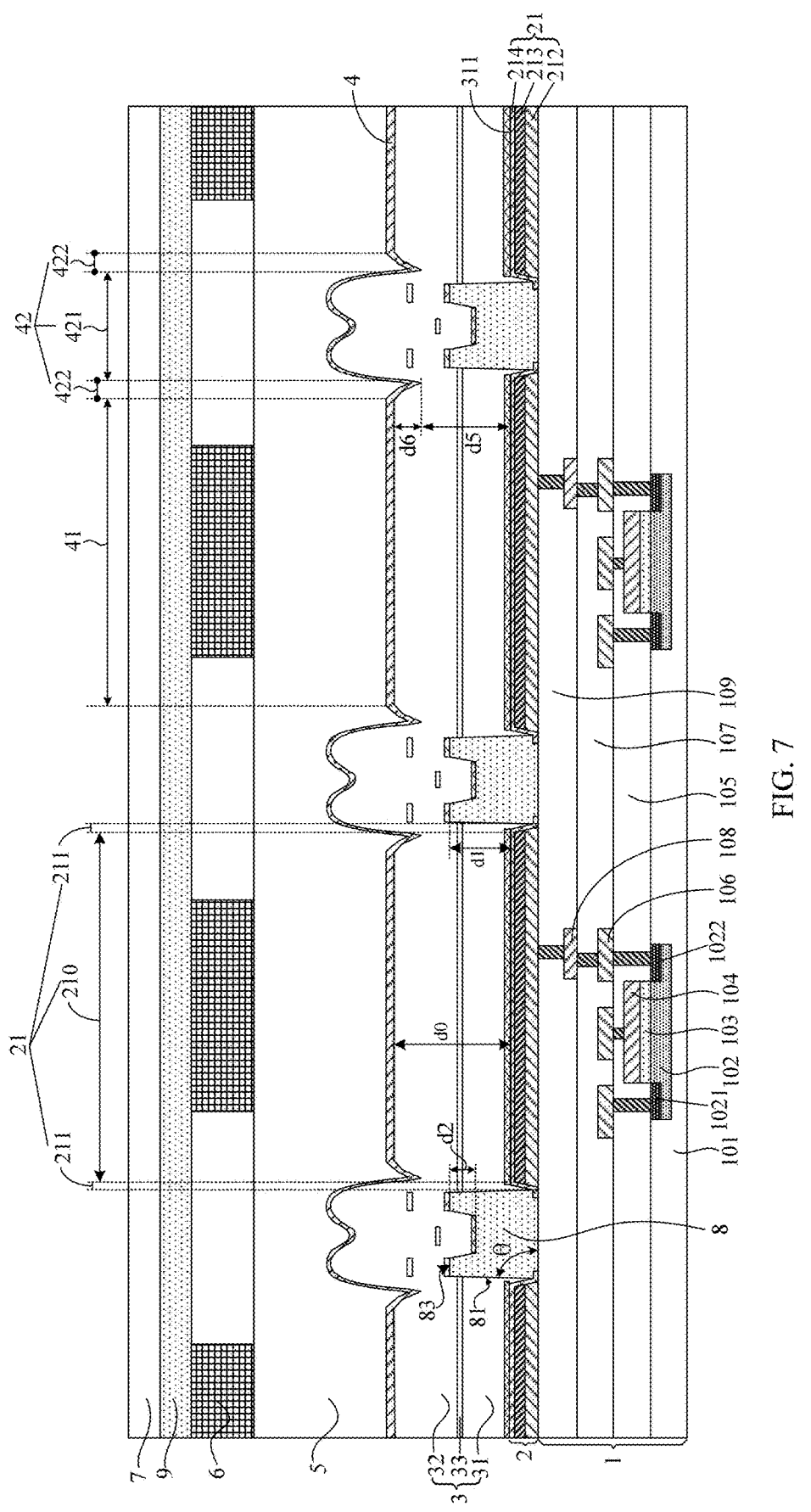
FIG. 7 is a schematic diagram of a structure of an A-A section of the display substrate shown in FIG. 2 in an exemplary embodiment.

FIG. 7 is a schematic diagram of a structure of an A-A section of the display substrate shown in FIG. 2 in an exemplary embodiment. In an exemplary embodiment, as shown in FIG. 7, the light emitting functional layer 3 may include a first light emitting unit layer 31 and a second light emitting unit layer 32 which are stacked, and a charge generation layer 33 located between the first light emitting unit layer 31 and the second light emitting unit layer 32. The charge generation layer 33 connects the first light emitting unit layer 31 with the second light emitting unit layer 32 in series. The first light emitting unit layer 31 includes a hole injection layer 311, and the hole injection layers 311 located at both sides of the leakage cutoff layer 8 are disconnected from each other. The charge generation layers 33 located at both sides of the leakage cutoff layer 8 are disconnected from each other.

In the display substrate shown in FIG. 7, the charge generation layers 33 located at both sides of the leakage cutoff layer 8 are disconnected from each other, so that in a one pixel working state (that is, one pixel emits light), the current will not transmit to other adjacent pixels through the charge generation layer, thereby avoiding lateral leakage, avoiding the phenomenon of concomitant light emitting or crosstalk, improving the color gamut of a display and improving the quality and color purity of the display.

In an exemplary embodiment, as shown in FIGS. 3 to 7, a distance d6 between a position of the concave portion 422 closest to the driving backplane and a surface of one side of the gentle portion 41 facing the driving backplane in the direction perpendicular to the driving backplane is less than 60 nm (nanometer). A distance d5 between the position of the concave portion 422 closest to the driving backplane and the middle portion 210 of the first electrode 21 in the direction perpendicular to the driving backplane is 100 nm to 300 nm. Such an arrangement mode may reduce the risk of point discharge or short circuit between the concave portion 422 and the first electrode 21, thereby improving the stability of the OLED light emitting device.

Figure 9:
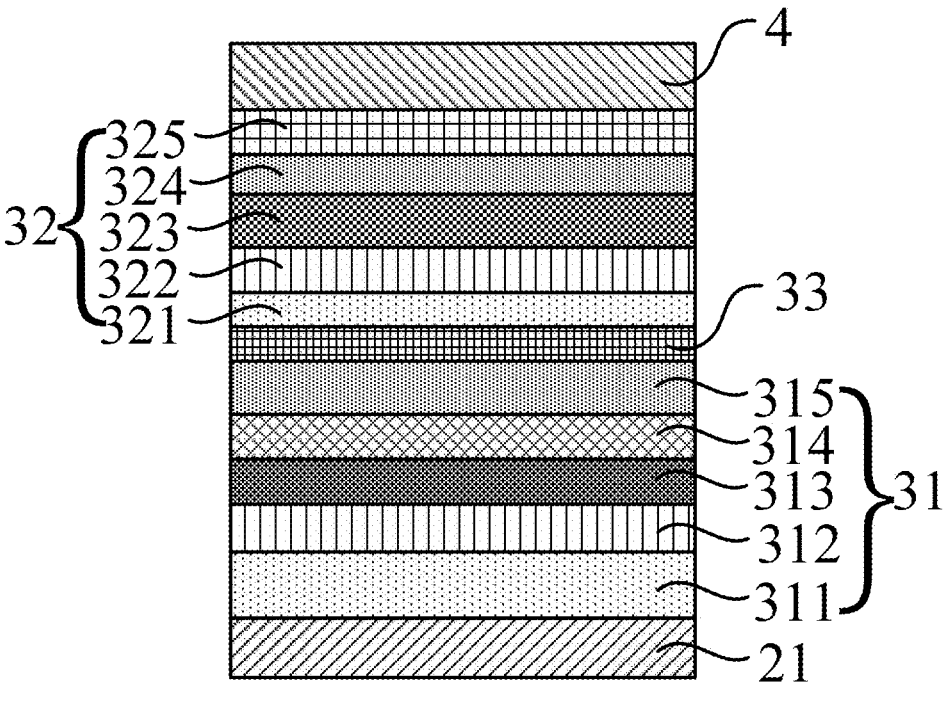
FIG. 9 is a schematic diagram of a structure of a stacked series-connected OLED device.

FIG. 9 is a schematic diagram of a structure of a stacked series-connected OLED device. In an exemplary embodiment, as shown in FIG. 9, the stacked series-connected OLED device includes a first electrode 21, a second electrode layer 4, and a light emitting functional layer located between the first electrode 21 and the second electrode layer 4. The light emitting functional layer may include a first light emitting unit layer 31 and a second light emitting unit layer 32 which are stacked, and a charge generation layer 33 located between the first light emitting unit layer 31 and the second light emitting unit layer 32.

As shown in FIG. 9, the first light emitting unit layer 31 may include a first hole injection layer 311, a first hole transport layer 312, a first light emitting layer 313, a second light emitting layer 314 and a first electron transport layer 315 which are sequentially stacked from the first electrode 21 towards the second electrode layer 4. The second light emitting unit layer 32 may include a second hole injection layer 321, a second hole transport layer 322, a third light emitting layer 323, a second electron transport layer 324 and a second electron injection layer 325 which are sequentially stacked from the first electrode 21 towards the second electrode layer 4.

In an exemplary embodiment, as shown in FIG. 9, the thickness of the first hole injection layer 311 may be 70 angstroms to 130 angstroms. For example, the thickness of the first hole injection layer 311 may be any one of 70 angstroms, 80 angstroms, 90 angstroms, 100 angstroms, 110 angstroms, 120 angstroms and 130 angstroms.

In an exemplary embodiment, as shown in FIG. 9, the thickness of the first hole transport layer 312 may be 70 angstroms to 130 angstroms. For example, the thickness of the first hole transport layer 312 may be any one of 70 angstroms, 80 angstroms, 90 angstroms, 100 angstroms, 110 angstroms, 120 angstroms and 130 angstroms.

In an exemplary embodiment, as shown in FIG. 9, the thickness of the first light emitting layer 313 may be 70 angstroms to 130 angstroms. For example, the thickness of the first light emitting layer 313 may be any one of 70 angstroms, 80 angstroms, 90 angstroms, 100 angstroms, 110 angstroms, 120 angstroms and 130 angstroms.

In an exemplary embodiment, as shown in FIG. 9, the thickness of the second light emitting layer 314 may be 250 angstroms to 350 angstroms. For example, the thickness of the second light emitting layer 314 may be any one of 250 angstroms, 280 angstroms, 300 angstroms, 320 angstroms and 350 angstroms.

In an exemplary embodiment, as shown in FIG. 9, the thickness of the first electron transport layer 315 may be 150 angstroms to 250 angstroms. For example, the thickness of the first electron transport layer 315 may be any one of 150 angstroms, 180 angstroms, 200 angstroms, 220 angstroms and 250 angstroms.

In an exemplary embodiment, as shown in FIG. 9, the thickness of the charge generation layer 33 may be 100 angstroms to 200 angstroms. For example, the thickness of the charge generation layer 33 may be any one of 100 angstroms, 130 angstroms, 150 angstroms, 180 angstroms and 200 angstroms.

In an exemplary embodiment, as shown in FIG. 9, the thickness of the second hole injection layer 321 may be 70 angstroms to 130 angstroms. For example, the thickness of the second hole injection layer 321 may be any one of 70 angstroms, 80 angstroms, 90 angstroms, 100 angstroms, 110 angstroms, 120 angstroms and 130 angstroms.

In an exemplary embodiment, as shown in FIG. 9, the thickness of the second hole transport layer 322 may be 70 angstroms to 130 angstroms. For example, the thickness of the second hole transport layer 322 may be any one of 70 angstroms, 80 angstroms, 90 angstroms, 100 angstroms, 110 angstroms, 120 angstroms and 130 angstroms.

In an exemplary embodiment, as shown in FIG. 9, the thickness of the third light emitting layer 323 may be 200 angstroms to 300 angstroms. For example, the thickness of the third light emitting layer 323 may be any one of 200 angstroms, 230 angstroms, 250 angstroms, 280 angstroms and 300 angstroms.

In an exemplary embodiment, as shown in FIG. 9, the thickness of the second electron transport layer 324 may be 250 angstroms to 350 angstroms. For example, the thickness of the second electron transport layer 324 may be any one of 250 angstroms, 280 angstroms, 300 angstroms, 320 angstroms and 350 angstroms.

In an exemplary embodiment, as shown in FIG. 9, the thickness of the second electron injection layer 325 may be 800 angstroms to 1000 angstroms. For example, the thickness of the second electron injection layer 325 may be any one of 800 angstroms, 820 angstroms, 840 angstroms, 850 angstroms, 880 angstroms, 900 angstroms, 920 angstroms, 940 angstroms, 950 angstroms, 980 angstroms and 1000 angstroms.

In an exemplary embodiment, the first light emitting layer 313 may be a light emitting layer that can emit red light. The second light emitting layer 314 may be a light emitting layer that can emit green light. The third light emitting layer 323 may be a light emitting layer that can emit blue light.

In an exemplary embodiment, as shown in FIG. 3, the first electrode 21 may be a multilayer structure. For example, the first electrode 21 may include a composite conductive layer located on the surface of the driving backplane and a protective conductive layer 214 located at one side of the composite conductive layer away from the driving backplane. A periphery of the protective conductive layer 214 extends at a certain slope towards the driving backplane, and is in contact with the surface of the driving backplane to form the climbing portion 211.

In an exemplary embodiment, a material of the protective conductive layer 214 may include at least one of indium tin oxide (ITO) and indium zinc oxide (IZO).

In an exemplary embodiment, the composite conductive layer may include a first conductive layer 212 and a second conductive layer 213 which are sequentially stacked from the driving backplane 1 towards the light emitting functional layer 3. A material of the first conductive layer 212 may include titanium (Ti), and a material of the second conductive layer 213 may include at least one of silver (Ag) and aluminum (Al).

In an exemplary embodiment, the composite conductive layer may include a first conductive layer 212, a second conductive layer 213 and a third conductive layer (not shown in the figure) which are sequentially stacked from the driving backplane 1 towards the light emitting functional layer 3. The material of the first conductive layer 212 may include titanium (Ti), the material of the second conductive layer 213 may include at least one of silver (Ag) and aluminum (Al), and a material of the third conductive layer may include titanium.

The periphery of the protective conductive layer 214 extends at a certain slope towards the driving backplane and is in contact with the surface of the driving backplane, so that the protective conductive layer 214 may clad the composite conductive layer and protect the second conductive layer 213 (the second conductive layer may be used as a reflective layer) in the composite conductive layer. Therefore, the influence of the etching process on the second conductive layer may be prevented during etching.

In an exemplary embodiment, as shown in FIGS. 3 to 7, the driving backplane 1 may include a plurality of driving transistors, which are used for driving a light emitting device to emit light to display images. Taking a driving transistor with a top gate structure as an example, the driving backplane 1 includes a base substrate 101, a gate insulating layer 103, a gate 104, a first insulating layer 105 and a first wiring layer 106. A material of the base substrate 101 may be monocrystalline silicon, polysilicon, or the like, which is not particularly limited herein. The base substrate 101 may include an active region 102 and a source 1021 and a drain 1022 located at both ends of the active region 102. The gate insulating layer 103 overlies the active region 102. The gate 104 is disposed on a surface of the gate insulating layer 103 away from the base substrate 101. The first insulating layer 105 overlies the gate 104 and the base substrate 101, and a material of the first insulating layer 105 may include at least one of silicon oxide and silicon nitride. The first wiring layer 106 is disposed on a surface of the first insulating layer 105 away from the base substrate 101. The first wiring layer 106 includes a plurality of metal wires. The gate 104, the source 1021 and the drain 1022 are each connected to corresponding metal wires in the first wiring layer 106 through a via hole filled with tungsten or other metals. In an exemplary embodiment, a material of the gate 104 may be heavily doped polysilicon.

In addition, the driving backplane 1 may further include a second insulating layer 107 and a second wiring layer 108, the second insulating layer 107 overlies the first wiring layer 106 and the first insulating layer 105, the second wiring layer 108 is disposed on a surface of the second insulating layer 107 away from the base substrate 101, a pattern of the second wiring layer 108 is not limited herein, and the second wiring layer 108 may be connected to the first wiring layer 106 through a via hole filled with tungsten or other metals. A planarization layer 109 may overlie the second wiring layer 108, the first electrode layer 2 may be disposed on a surface of the planarization layer 109 away from the base substrate 101, and the first electrode 21 may be connected to the second wiring layer 108 through a via hole filled with tungsten or other metals.

In an exemplary embodiment, as shown in FIGS. 3 to 7, the display substrate may further include a first encapsulation layer 5, a color filter layer 6, a second encapsulation layer 9 and a transparent cover plate 7. The first encapsulation layer 5 may overlie the second electrode layer 4. For example, the first encapsulation layer 5 may include two inorganic layers and an organic layer between the two inorganic layers. The color filter layer 6 is located at one side of the first encapsulation layer 5 away from the second electrode layer 4, and the color filter layer 6 includes filter areas which are in one-to-one correspondence with the first electrodes 21. The filter areas have multiple colors, such as red, blue and green. The second encapsulation layer 9 may overlie the color filter layer 6, and the structure of the second encapsulation layer 9 may be the same as that of the first encapsulation layer 5. The transparent cover plate 7 may overlie the second encapsulation layer 9, and a material of the transparent cover plate 7 may be glass or other transparent materials.

The structure of the display substrate in accordance with an embodiment of the present disclosure will be described below through an exemplary preparation process of the display substrate. "Patterning process" is used hereinafter to represent a process of forming a pattern each time. "Patterning process" may include photoresist coating, mask exposure, development, etching, photoresist stripping, etc., for inorganic materials (e.g., metal layers, inorganic layers, etc.), and may include mask exposure, development, etc., for organic materials (e.g., photoresists, organic resins, etc.). Any one or more of sputtering, evaporation and chemical vapor deposition may be used for deposition, any one or more of spray coating and spin coating may be used for coating, and any one or more of dry etching and wet etching may be used for etching. A "thin film" refers to a layer of thin film manufactured with a certain material on a base substrate using a deposition or coating process. If the "thin film" does not need the patterning process in the entire manufacturing process, the "thin film" may also be called a "layer". If the "thin film" needs the patterning process in the entire manufacturing process, the "thin film" is called a "thin film" before the patterning process is performed and is called a "layer" after the patterning process is performed. The "layer" which has experienced the patterning process includes at least one "pattern". "A and B being disposed on the same layer" in an embodiment of the present disclosure means that A and B are formed simultaneously through a single patterning process. The "thickness" of the film layer is the dimension of the film layer in a direction perpendicular to the driving backplane.

In S1, a first electrode layer is formed on a surface of a planarization layer 109 of a driving backplane, wherein the first electrode layer includes a plurality of first electrodes 21 distributed in an array, the first electrode 21 may include a composite conductive layer and a protective conductive layer 214 which are sequentially stacked from the surface of the driving backplane towards a direction away from the driving backplane. This step may include the following steps.

In S11, an adhesive layer is coated on a surface of one side of the driving backplane 1 (the surface of the planarization layer 109), and the adhesive layer is mask exposed and developed to form a fully exposed area in the position of the first electrode to remove the adhesive layer to expose the surface of the driving backplane, and an unexposed area in the other position to retain the adhesive layer. In an exemplary embodiment, the adhesive layer includes an anti-reflective adhesive 201 and a photoresist 202 which are stacked. The step S11 may include the following steps.

Figure 10A:
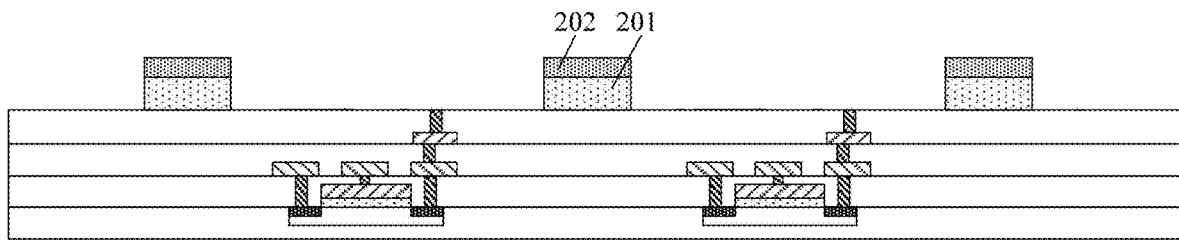
FIG. 10a is a schematic diagram of a structure of a display substrate after a pattern of an adhesive layer is formed.

An anti-reflective adhesive (Barc adhesive) 201 and a photoresist 202 are coated sequentially on the surface of one side of the driving backplane, and the photoresist 202 and the Barc adhesive 201 are mask exposed and developed to form a fully exposed area in the position of the first electrode to remove the adhesive layer to expose the surface of the driving backplane, and an unexposed area in the other position to retain the Barc adhesive and the photoresist to form a pattern of the adhesive layer, as shown in FIG. 10*a*, which is a schematic diagram of a structure of the display substrate after the pattern of the adhesive layer is formed.

Figure 10B:
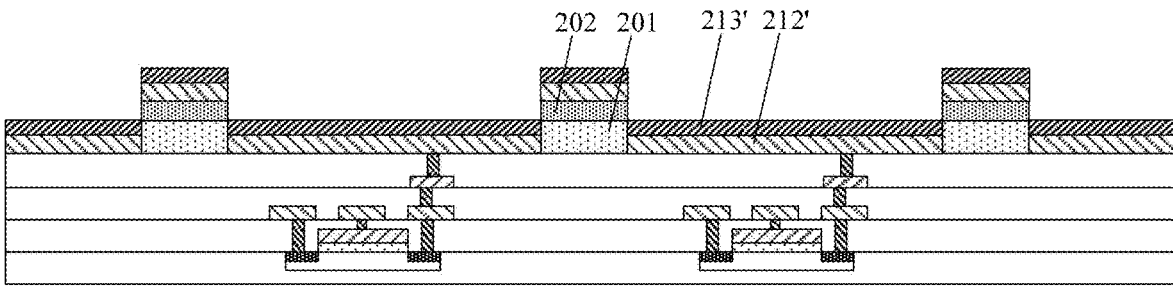
FIG. 10b is a schematic diagram of a structure of a display substrate after a composite conductive thin film is deposited.

In S12, a composite conductive thin film is deposited on the driving backplane, on which the pattern of the adhesive layer is formed, wherein in the fully exposed area, the composite conductive thin film is deposited on the surface of the driving backplane, and in the unexposed area, the composite conductive thin film is deposited on a surface of the adhesive layer, as shown in FIG. 10*b*, which is a schematic diagram of a structure of the display substrate after the composite conductive thin film is deposited.

In an exemplary embodiment, the composite conductive thin film includes a first conductive thin film 212' and a second conductive thin film 213' which are sequentially stacked from the driving backplane 1 towards the light emitting functional layer 3. The material of the first conductive thin film 212' includes titanium, and the material of the second conductive thin film 213' includes at least one of silver and aluminum.

In an exemplary embodiment, the composite conductive thin film may include a first conductive thin film 212', a second conductive thin film 213' and a third conductive thin film (not shown in the figure) which are sequentially stacked from the driving backplane 1 towards the light emitting functional layer 3. The material of the first conductive thin film 212' includes titanium, the material of the second conductive thin film 213' includes at least one of silver and aluminum, and the material of the third conductive thin film may include titanium.

In an exemplary embodiment, the first conductive thin film, the second conductive thin film and the third conductive thin film may be formed by electron beam evaporation.

In S13, the adhesive layer in the unexposed area is removed to remove the composite conductive thin film on the surface of the adhesive layer, the composite conductive thin film located in the fully exposed area forming a composite conductive layer. Step S13 may include: stripping the photoresist 202 from the unexposed area, the composite conductive thin film on the photoresist being removed together with the photoresist; and removing the remaining Barc adhesive 201 by the developing process. Therefore, the composite conductive thin film located in the fully exposed area forms a composite conductive layer, as shown in FIG. 10*c*, which is a schematic diagram of a structure of the display substrate after the composite conductive layer is formed.

Figure 10C:
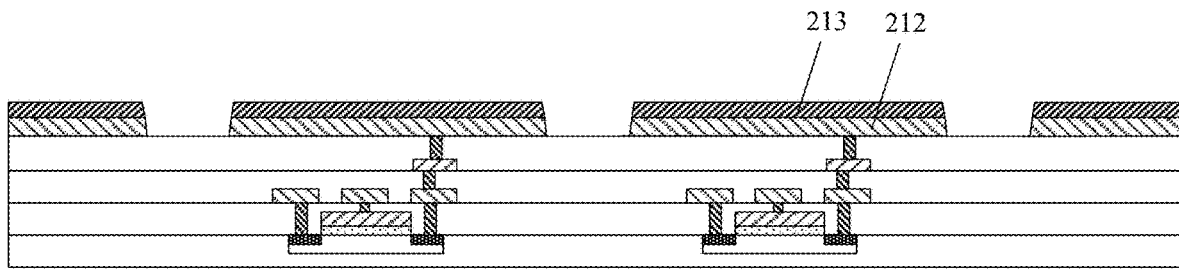
FIG. 10c is a schematic diagram of a structure of a display substrate after a composite conductive layer is formed.

In an exemplary embodiment, as shown in FIG. 10*c*, the composite conductive layer may include a first conductive layer 212 and a second conductive layer 213 which are sequentially stacked from the driving backplane towards the light emitting functional layer. The material of the first conductive layer 212 includes titanium, and the material of the second conductive layer 213 includes at least one of silver and aluminum.

In an exemplary embodiment, the composite conductive layer may include a first conductive layer, a second conductive layer and a third conductive layer which are sequentially stacked from the driving backplane towards the light emitting functional layer. The material of the first conductive layer includes titanium, the material of the second conductive layer includes at least one of silver and aluminum, and the material of the third conductive layer includes titanium.

In S14, a protective conductive thin film is deposited on the surface of the driving backplane, on which the composite conductive layer is formed, and the protective conductive thin film is patterned using a patterning process including dry etching to form a protective conductive layer overlying the composite conductive layer, the periphery of the protective conductive layer being in contact with the surface of the driving backplane. In an exemplary embodiment, S14 may include the following steps.

A protective conductive thin film is deposited on the surface of the driving backplane, on which the composite conductive layer is formed, and a photoresist is coated on the protective conductive thin film; the photoresist is mask exposed and developed to form an unexposed area in the position of the first electrode to retain the photoresist, and a fully exposed area in the other position which is free of photoresist to expose the protective conductive thin film; the exposed protective conductive thin film is dry etched; and the remaining photoresist is stripped off to form a pattern of a protective conductive layer 214. The protective conductive layer 214 overlies the composite conductive layer. The periphery of the protective conductive layer 214 extends towards the driving backplane and is in contact with the surface of the driving backplane, as shown in FIG. 11, which is a schematic diagram of a structure of the display substrate after the protective conductive layer is formed.

The periphery of the protective conductive layer 214 extends towards the driving backplane and is in contact with the surface of the driving backplane, so that the protective conductive layer 214 may clad the composite conductive layer to protect the second conductive layer 213 (the second conductive layer may be used as a reflective layer) in the composite conductive layer. The influence of the etching process on the second conductive layer may be prevented during etching. The material of the protective conductive layer 214 may include at least one of indium tin oxide (ITO) and indium zinc oxide (IZO). In an exemplary embodiment, the protective conductive thin film may be deposited by electron beam evaporation.

Figure 11:
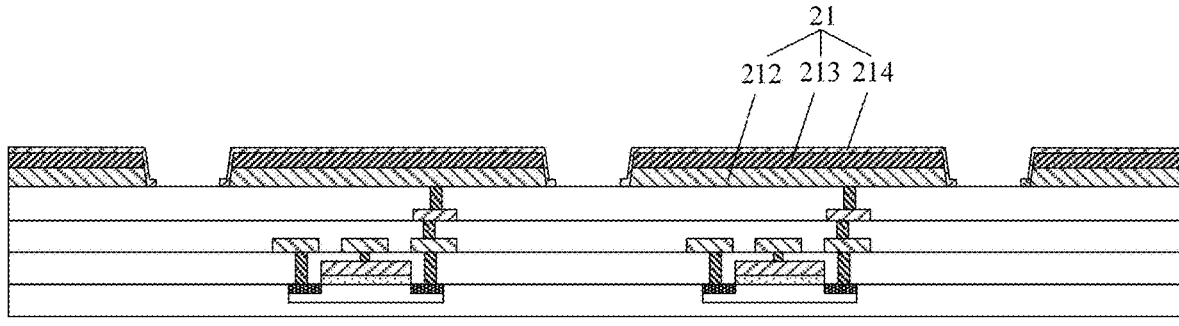
FIG. 11 is a schematic diagram of a structure of a display substrate after a protective conductive layer is formed.

As shown in FIG. 11, the periphery of the protective conductive layer 214 extends to the driving backplane at a certain slope, and is in contact with the surface of the driving backplane to form the climbing portion 211.

No etching process is used in the process of forming the composite conductive layer, and dry etching is used in the process of forming the protective conductive layer. The method of forming the first electrode layer in such a way does not employ a wet etching process, thereby satisfying the requirement of high PPI of the display panel. Furthermore, the etching process is no longer used in the process of forming the second conductive layer (a metallic silver pattern), thereby overcoming the problem that dry etching of the metal silver is difficult.

In S2, a leakage cutoff layer 8 is formed on the surface of the driving backplane, on which the first electrode layer is formed, the leakage cutoff layer 8 being located between two adjacent first electrodes 21. This step may include: forming a leakage cutoff thin film on the driving backplane, on which the first electrode layer is formed, and patterning the leakage cutoff thin film through a patterning process to form a leakage cutoff layer 8 located between two adjacent first electrodes, there being a cutoff groove 82 and cutoff protrusions 83 located at both sides of the cutoff groove 82 on a surface of one side of the leakage cutoff layer 8 away from the driving backplane. In an exemplary embodiment, the material of the leakage cutoff layer 8 may include at least one of silicon oxide and silicon nitride. In an exemplary embodiment, the material of the leakage cutoff layer may be an organic material, such as a resin material, etc.

In S3, a light emitting functional layer is formed at one side of the leakage cutoff layer and the first electrode layer away from the driving backplane, wherein the light emitting functional layer includes a first hole injection layer at one side of the leakage cutoff layer and the first electrode layer away from the driving backplane, and the first hole injection layers located at both sides of the leakage cutoff layer are disconnected from each other. For example, the organic film layer of the light emitting functional layer may be evaporated on the driving backplane using the method of large-opening mask evaporation. When the light emitting structure layer is evaporated using a large-opening mask, the first hole injection layers and the charge generation layers at both sides of the leakage cutoff layer are disconnected from each other.

In S4, a second electrode layer is formed at one side of the light emitting functional layer away from the driving backplane. The second electrode layer may be formed using a conventional technology in the art, and the second electrode layer is a continuous film layer, that is, the second electrode layers of a plurality of OLED light-emitting devices are a continuous integrated film layer. In an exemplary embodiment, the second electrode layer may be formed by atomic layer deposition (ALD), such that the second electrode layer may be prevented from breaking, ensuring that the second electrode layer is a continuous film layer.

It may be understood by those skilled in the art that the first encapsulation layer 5, the color filter layer 6 and the second encapsulation layer 9 may be formed sequentially on the second electrode layer using the conventional technologies in the art, which will not be repeated herein.

An embodiment of the present disclosure further provides a method for preparing a display substrate, as shown in FIG. 12, which is a schematic diagram of a method for preparing a display substrate in an exemplary embodiment. The method for preparing a display substrate may include:

forming a first electrode layer on a surface of one side of a driving backplane, the first electrode layer including a plurality of first electrodes distributed in an array;

forming a leakage cutoff layer on the surface of the driving backplane, on which the first electrode layer is formed, the leakage cutoff layer being located between two adjacent first electrodes, and there being a cutoff groove and cutoff protrusions located at both sides of the cutoff groove on a surface of one side of the leakage cutoff layer away from the driving backplane;

forming a light emitting functional layer at one side of the leakage cutoff layer and the first electrode layer away from the driving backplane; and forming a second electrode layer at one side of the light emitting functional layer away from the driving backplane.

An embodiment of the present disclosure further provides a display apparatus which includes the display substrate using the aforementioned embodiments. The display apparatus may be any product or component with a display function, such as a mobile phone, a tablet computer, a television, a display, a notebook computer, a digital photo frame, or a navigator.

Although the implementations disclosed in the present disclosure are described as above, the described contents are only implementations which are used in order to facilitate understanding of the present disclosure, and are not intended to limit the present disclosure. Any skilled person in the art to which the present disclosure pertains may make any modifications and alterations in forms and details of implementation without departing from the spirit and scope of the present disclosure. However, the patent protection scope of the present disclosure should be subject to the scope defined by the appended claims.

The invention claimed is:

1. A display substrate, comprising:
    a driving backplane;
    a first electrode layer located at one side of the driving backplane, the first electrode layer comprising a plurality of first electrodes distributed in an array;
    a leakage cutoff layer located at one side of the first electrode layer away from the driving backplane, the leakage cutoff layer being located between two adjacent first electrodes, and there being a cutoff groove and cutoff protrusions located at both sides of the cutoff groove on a surface of one side of the leakage cutoff layer away from the driving backplane;
    a light emitting functional layer located at one side of the leakage cutoff layer and the first electrode layer away from the driving backplane; and
    a second electrode layer located at one side of the light emitting functional layer away from the driving backplane; wherein
    a first electrode of the plurality of first electrodes comprises a flat middle portion and a climbing portion surrounding the middle portion;
    the second electrode layer comprises a plurality of gentle portions and connecting portions located between two adjacent gentle portions, wherein a gentle portion of the plurality of gentle portions corresponds to the middle portion;
    in a direction perpendicular to the driving backplane, the thickness of the light emitting functional layer located between the gentle portion and the middle portion is $d0$, and the minimum distance between a cutoff protrusion of the cutoff protrusions and the middle portion is $d1$, a ratio of $d1$ to $d0$ ranging from 0.3 to 0.8;
    when the light emitting functional layer is evaporated, a first hole injection layer of the light emitting functional layer is cut off by the leakage cutoff layer.

2. The display substrate according to claim 1, wherein a distance between the cutoff groove and the cutoff protrusion in the direction perpendicular to the driving backplane is $d2$, and a ratio of $d2$ to $d0$ ranges from 0.1 to 0.4.

3. The display substrate according to claim 1, wherein the leakage cutoff layer has a cutoff side surface facing the first electrode, the leakage cutoff layer shrinks from the driving backplane towards a direction away from the driving backplane, and an angle between the cutoff side surface and a surface of one side of the leakage cutoff layer facing the driving backplane is 60° to 90°.

4. The display substrate according to claim 1, wherein the leakage cutoff layer has a cutoff side surface facing the first electrode, the leakage cutoff layer expands from the driving backplane towards a direction away from the driving backplane, and an angle between the cutoff side surface and a surface of one side of the leakage cutoff layer facing the driving backplane is 90° to 120°.

5. The display substrate according to claim 1, wherein an orthographic projection of the leakage cutoff layer on the driving backplane is between orthographic projections of two adjacent middle portions on the driving backplane.

6. The display substrate according to claim 1, wherein an orthographic projection of the leakage cutoff layer on the driving backplane at least overlaps with an orthographic projection of the middle portion located at one side of the leakage cutoff layer on the driving backplane.

7. The display substrate according to claim 6, wherein in a direction perpendicular to the driving backplane, a distance between the cutoff protrusion and the middle portion is d1, the thickness of the middle portion is d3, and a ratio of d3 to d1 is 2 to 4.

8. The display substrate according to claim 6, wherein in a direction perpendicular to the driving backplane, the thickness of the light emitting functional layer located between the gentle portion and the middle portion is d0, the depth of the cutoff groove is d2, and a ratio of d2 to d0 is 0.2 to 0.8.

9. The display substrate according to claim 8, wherein the depth of the cutoff groove is greater than or equal to the thickness of the middle portion.

10. The display substrate according to claim 1, wherein the light emitting functional layer comprises a first light emitting unit layer, a charge generation layer and a second light emitting unit layer which are sequentially stacked from the first electrode layer towards the second electrode layer, and the first light emitting unit layer comprises the first hole injection layer, a first hole transport layer, a first light emitting layer, a second light emitting layer and a first electron transport layer which are sequentially stacked from the first electrode layer towards the second electrode layer.

11. The display substrate according to claim 10, wherein the thickness of the charge generation layer is 100 angstroms to 200 angstroms;

the thickness of the first hole injection layer is 70 angstroms to 130 angstroms; or
the thickness of the first hole transport layer is 70 angstroms to 130 angstroms; or
the thickness of the first light emitting layer is 70 angstroms to 130 angstroms; or
the thickness of the second light emitting layer is 250 angstroms to 350 angstroms; or
the thickness of the first electron transport layer is 150 angstroms to 250 angstroms.

12. The display substrate according to claim 10, wherein the first light emitting layer is a red light emitting layer and the second light emitting layer is a green light emitting layer.

13. The display substrate according to claim 1, wherein the light emitting functional layer comprises a first light emitting unit layer, a charge generation layer and a second light emitting unit layer which are sequentially stacked from the first electrode layer towards the second electrode layer, and the second light emitting unit layer comprises a second hole injection layer, a second hole transport layer, a third light emitting layer, a second electron transport layer and a second electron injection layer which are sequentially stacked from the first electrode layer towards the second electrode layer.

14. The display substrate according to claim 13, wherein the thickness of the second hole injection layer is 70 angstroms to 130 angstroms; or
the thickness of the second hole transport layer is 70 angstroms to 130 angstroms; or
the thickness of the third light emitting layer is 200 angstroms to 300 angstroms; or
the thickness of the second electron transport layer is 250 angstroms to 350 angstroms; or
the thickness of the second electron injection layer is 800 angstroms to 1000 angstroms.

15. The display substrate according to claim 13, wherein the third light emitting layer is a blue light emitting layer.

16. The display substrate according to claim 1, wherein a connecting portion of the connecting portions comprises a convex portion and concave portions located at both sides of the convex portion, the convex portion protrudes towards a side away from the driving backplane, the concave portion is recessed towards a side of the driving backplane, the concave portion connects the convex portion with the gentle portion, and
a distance between a position of the concave portion closest to the driving backplane and the middle portion in the direction perpendicular to the driving backplane is 100 nm to 300 nm.

17. The display substrate according to claim 16, wherein a distance between the position of the concave portion closest to the driving backplane and a surface of one side of the gentle portion facing the driving backplane in the direction perpendicular to the driving backplane is less than 60 nm.

18. A display apparatus, comprising the display substrate according to claim 1.

19. A method for preparing a display substrate, comprising:

forming a first electrode layer on a surface of one side of a driving backplane, the first electrode layer comprising a plurality of first electrodes distributed in an array;
forming a leakage cutoff layer on the surface of the driving backplane, on which the first electrode layer is formed, the leakage cutoff layer being located between two adjacent first electrodes, and there being a cutoff groove and cutoff protrusions located at both sides of the cutoff groove on a surface of one side of the leakage cutoff layer away from the driving backplane;
forming a light emitting functional layer at one side of the leakage cutoff layer and the first electrode layer away from the driving backplane; and
forming a second electrode layer at one side of the light emitting functional layer away from the driving backplane; wherein
a first electrode of the plurality of first electrodes comprises a flat middle portion and a climbing portion surrounding the middle portion;
the second electrode layer comprises a plurality of gentle portions and connecting portions located between two adjacent gentle portions, wherein a gentle portion of the plurality of gentle portions corresponds to the middle portion;

in a direction perpendicular to the driving backplane, the thickness of the light emitting functional layer located between the gentle portion and the middle portion is d0, and the minimum distance between a cutoff protrusion of the cutoff protrusions and the middle portion is d1, a ratio of d1 to d0 ranging from 0.3 to 0.8;

when the light emitting functional layer is evaporated, a first hole injection layer of the light emitting functional layer is cut off by the leakage cutoff layer.

\* \* \* \* \*